US009171749B2

(12) United States Patent
Dang et al.

(10) Patent No.: US 9,171,749 B2
(45) Date of Patent: Oct. 27, 2015

(54) HANDLER WAFER REMOVAL FACILITATED BY THE ADDITION OF AN AMORPHOUS CARBON LAYER ON THE HANDLER WAFER

(71) Applicant: International Business Machines Corporation, Armonk, NY (US)

(72) Inventors: Bing Dang, Chappaqua, NY (US); Sarah H. Knickerbocker, Hopewell Junction, NY (US); Douglas C. La Tulipe, Jr., Guilderland, NY (US); Spyridon Skordas, Wappingers Falls, NY (US); Cornelia K. Tsang, Mohegan Lake, NY (US); Kevin R. Winstel, East Greenbush, NY (US)

(73) Assignee: GLOBALFOUNDRIES U.S.2 LLC, Hopewell Junction, NY (US)

( * ) Notice: Subject to any disclaimer, the term of this patent is extended or adjusted under 35 U.S.C. 154(b) by 0 days.

(21) Appl. No.: 14/078,990

(22) Filed: Nov. 13, 2013

(65) Prior Publication Data

US 2015/0132924 A1 May 14, 2015

(51) Int. Cl.
*H01L 21/00* (2006.01)
*H01L 21/683* (2006.01)
*H01L 21/78* (2006.01)

(52) U.S. Cl.
CPC ............ *H01L 21/6836* (2013.01); *H01L 21/78* (2013.01)

(58) Field of Classification Search
CPC .................... H01L 21/0332; H01L 21/76814; H01L 21/3146; H01L 21/6836; H01L 21/78
USPC .................................. 257/798; 438/464, 795
See application file for complete search history.

(56) References Cited

U.S. PATENT DOCUMENTS

| 6,071,795 | A  | 6/2000  | Cheung et al.    |
|-----------|----|---------|------------------|
| 7,220,683 | B2 | 5/2007  | Yin et al.       |
| 7,323,401 | B2 | 1/2008  | Ramaswamy et al. |
| 7,842,622 | B1 | 11/2010 | Lee et al.       |
| 7,846,847 | B2 | 12/2010 | Park et al.      |

(Continued)

FOREIGN PATENT DOCUMENTS

| EP | 1548821 A2 | 6/2005 |
|----|------------|--------|
| EP | 2063460 A1 | 5/2009 |

OTHER PUBLICATIONS

Prosecution history, related PCT application PCT/CN2014/088526, International Search Report and Written Opinion, Jan. 15, 2015, all pages.

*Primary Examiner* — Duy T Nguyen
(74) *Attorney, Agent, or Firm* — Law Offices of Ira D. Blecker, P.C.

(57) ABSTRACT

A method of removing a handler wafer. There is provided a handler wafer and a semiconductor device wafer having a plurality of semiconductor devices, the semiconductor device wafer having an active surface side and an inactive surface side. An amorphous carbon layer is applied to a surface of the handler wafer. An adhesive layer is applied to at least one of the amorphous carbon layer of the handler wafer and the active surface side of the semiconductor device wafer. The handler wafer is joined to the semiconductor device wafer through the adhesive layer or layers. Laser radiation is applied to the handler wafer to cause heating of the amorphous carbon layer that in turn causes heating of the adhesive layer or layers. The plurality of semiconductor devices of the semiconductor device wafer are then separated from the handler wafer.

18 Claims, 4 Drawing Sheets

(56) References Cited

U.S. PATENT DOCUMENTS

| | | |
|---|---|---|
| 7,867,876 B2 | 1/2011 | Codding et al. |
| 8,067,296 B2 | 11/2011 | Kawana et al. |
| 2004/0262535 A1* | 12/2004 | Leblans ................. 250/483.1 |
| 2008/0014763 A1* | 1/2008 | Lu et al. ................. 438/795 |
| 2008/0248205 A1* | 10/2008 | Blanchet et al. ............. 427/282 |
| 2010/0006811 A1* | 1/2010 | Xu et al. ..................... 257/2 |
| 2010/0019365 A1* | 1/2010 | Matsumura et al. ......... 257/678 |
| 2010/0029059 A1* | 2/2010 | Matsumura et al. ......... 438/464 |
| 2012/0286429 A1 | 11/2012 | Han et al. |
| 2012/0329249 A1 | 12/2012 | Ahn et al. |
| 2013/0045570 A1 | 2/2013 | Schuegraf et al. |

\* cited by examiner

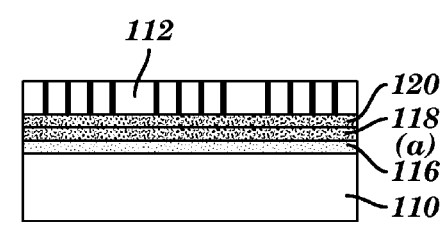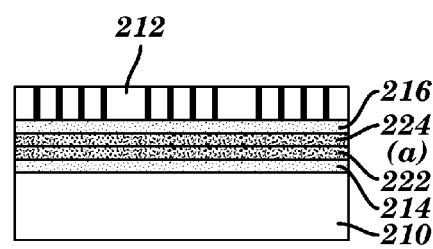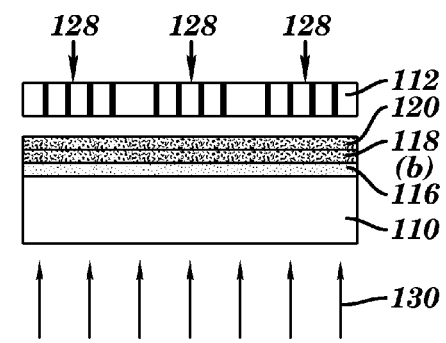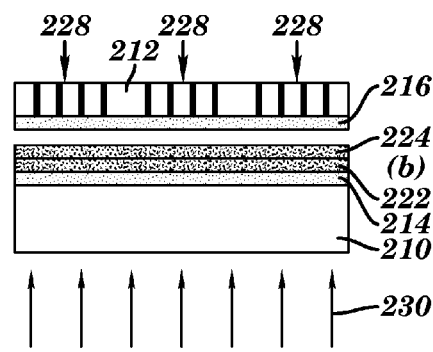
FIG. 4          FIG. 5

HANDLER WAFER REMOVAL FACILITATED BY THE ADDITION OF AN AMORPHOUS CARBON LAYER ON THE HANDLER WAFER

BACKGROUND

The present invention relates to the removal of a handler wafer from a semiconductor device wafer and, more particularly, relates to the addition of an amorphous carbon layer on the handler wafer which promotes efficient heating of the bonding layer between the handler wafer and semiconductor device layer to enable the separation of the handler wafer from the semiconductor device wafer.

Typical wafer-scale three dimensional (3D) integration involving chip-to-chip and chip-to-wafer bonding includes temporary bonding of a semiconductor device wafer to a handler wafer. The handler wafer may also be referred to as a carrier wafer.

In a typical process flow, semiconductor device wafers are bonded to an optically transparent handler wafer by use of an adhesive medium in order to facilitate the backside thinning of the semiconductor device wafer and then subsequent dicing and de-bonding of the handler wafer from the semiconductor device wafer.

Optically transparent wafers may be, for example, glass, quartz, sapphire. Optically transparent wafers have certain disadvantages in that they need to be engineered to have compatible coefficient of thermal expansion and ultraviolet light transparency with the silicon wafers that comprise most semiconductor device wafers. These optically transparent wafers further require separate wafer finishing fabrication facilities and tooling which makes them expensive.

The typical de-bonding process relies on optical/ultraviolet lasers for ablation of the bonding medium to enable release of the handler wafer from the semiconductor device wafer. Expensive optically transparent wafers must be used in this process which necessarily leads to higher costs.

BRIEF SUMMARY

The various advantages and purposes of the exemplary embodiments as described above and hereafter are achieved by providing, according to a first aspect of the exemplary embodiments, a method of removing a handler wafer which includes: providing a handler wafer and a semiconductor device wafer having a plurality of semiconductor devices, the semiconductor device wafer having an active surface side and an inactive surface side; applying an amorphous carbon layer to a surface of the handler wafer; applying an adhesive layer to at least one of the amorphous carbon layer of the handler wafer and the active surface side of the semiconductor device wafer; joining the handler wafer to the semiconductor device wafer through the adhesive layer or layers; applying laser radiation to the handler wafer to cause heating of the amorphous carbon layer that in turn causes heating of the adhesive layer or layers; and separating the plurality of semiconductor devices of the semiconductor device wafer from the handler wafer.

According to a second aspect of the exemplary embodiments, there is provided a method of removing a handler wafer which includes: providing a handler wafer and a semiconductor device wafer having a plurality of semiconductor devices, the semiconductor device wafer having an active surface side and an inactive surface side; applying a first amorphous carbon layer to a surface of the handler wafer; applying a second amorphous carbon layer to the active surface side of the semiconductor device wafer; applying an adhesive layer to at least one of the first amorphous carbon layer of the handler wafer and the second amorphous carbon layer of the semiconductor device wafer; joining the handler wafer to the semiconductor device wafer through the adhesive layer or layers; applying laser radiation to the handler wafer to cause heating of at least the first amorphous carbon layer that in turn causes heating of the adhesive layer or layers; and separating the plurality of semiconductor devices of the semiconductor device wafer from the handler wafer.

According to a third aspect of the exemplary embodiments, there is provided an assembly of a semiconductor wafer and a handler wafer which includes: a handler wafer and a semiconductor device wafer having a plurality of semiconductor devices, the semiconductor device wafer having an active surface side and an inactive surface side; an amorphous carbon layer on a surface of the handler wafer; at least one adhesive layer on the amorphous carbon layer of the handler wafer; and the handler wafer joined to the semiconductor device wafer through the at least one adhesive layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 4(a) to (b) illustrate an exemplary embodiment process in which a handler wafer is removed from a semiconductor wafer.

FIGS. 5(a) to (b) illustrate an exemplary embodiment process in which a handler wafer is removed from a semiconductor wafer.

DETAILED DESCRIPTION

Referring to the Figures in more detail, and particularly referring to FIGS. 1(a) to (f), there is illustrated a prior art process for removing a handler wafer from a plurality of semiconductor devices.

Figure 1:
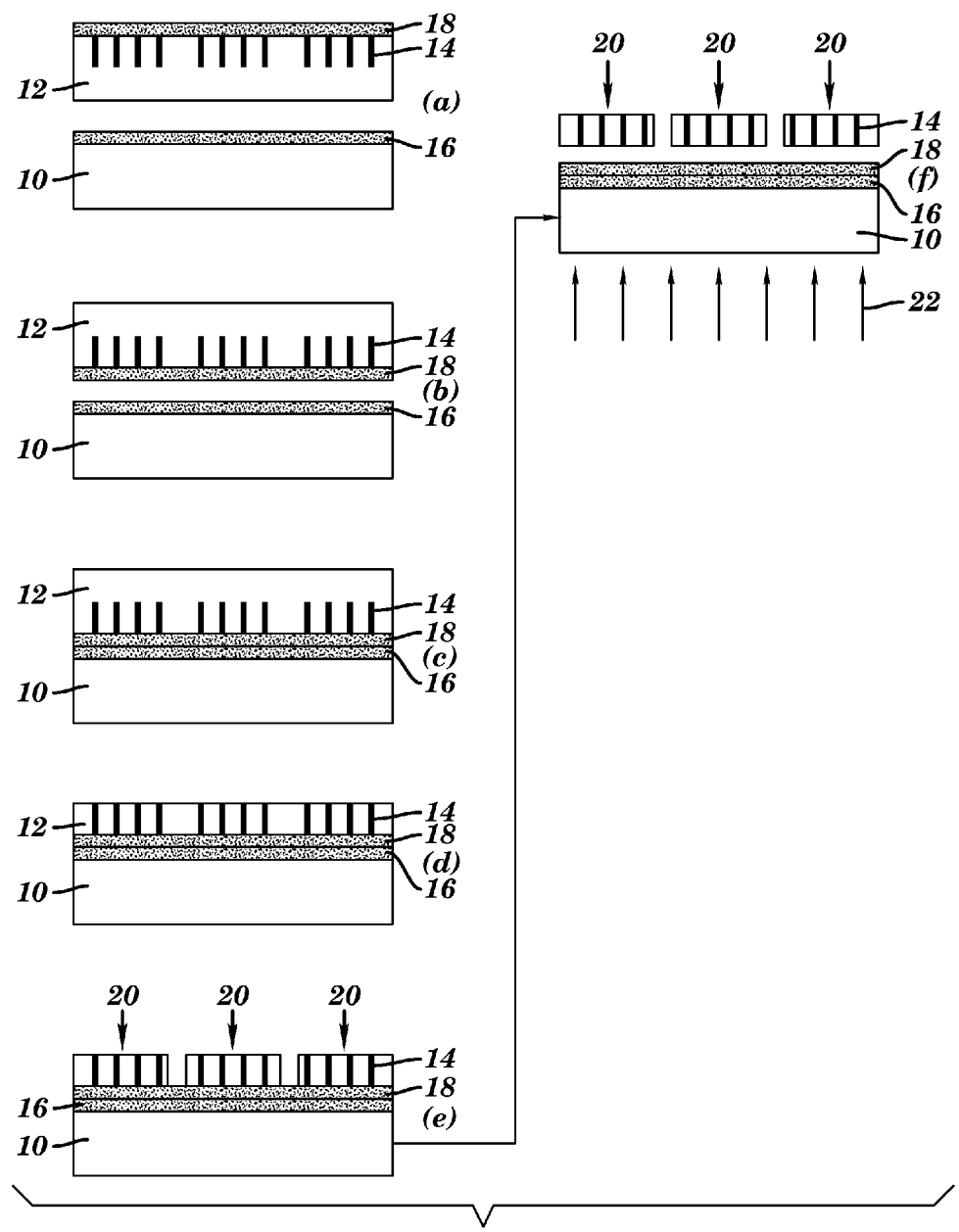
FIGS. 1(a) to (f) illustrate a prior art process for removing a handler wafer from a plurality of semiconductor devices.

As shown in FIG. 1(a), there is a handler wafer 10 and a semiconductor device wafer 12. The handler wafer 10 is an optically transparent wafer (as described above) which may have been engineered to have a coefficient of thermal expansion compatible with the coefficient of thermal expansion of the semiconductor device wafer 12. The handler wafer 10 is nonfunctional in that it contains no semiconductor devices or any wiring. The semiconductor device wafer 12 is made of a semiconductor material, usually silicon but could be any of the semiconductor materials currently in use or contemplated for use. The semiconductor device wafer 12 may further comprise through silicon vias (TSVs) 14 which extend at least partly through the semiconductor device wafer 12. The semiconductor device wafer 12 comprises a plurality of semiconductor devices. Each of the semiconductor devices may comprise transistors, capacitors, other components and various wirings, all of which are not shown for clarity.

The handler wafer 10 further comprises a first adhesive layer 16 directly in contact with the handler wafer 10 and the semiconductor device wafer 12 further comprises a second adhesive layer 18 directly in contact with the semiconductor device wafer 12.

Referring now to FIG. 1(b), the semiconductor device wafer 12 is flipped over so that the second adhesive layer 18 on the semiconductor device wafer 12 faces the first adhesive layer 16 on the handler wafer 10.

Referring now to FIG. 1(c), the handler wafer 10 and the semiconductor device wafer 12 undergo a thermal compression bonding process in which the first adhesive layer 16 adheres to the second adhesive layer 18.

Thereafter, the back side of the semiconductor device wafer 12 undergoes a thinning process to reduce the thickness of the semiconductor device wafer 12 as now shown in FIG. 1(d) after thinning.

The semiconductor device wafer 12 may undergo a dicing process in which a saw or laser singulates the semiconductor devices 20 that comprise the semiconductor device wafer 12. As shown in FIG. 1(e), there are a plurality of semiconductor devices 20.

At this point in the process, the plurality of semiconductor devices 20 are still adhered to the second adhesive layer 18. Referring now to FIG. 1(f), the handler wafer 10 is exposed to ultraviolet (UV) radiation 22 from a source such as a laser. The UV radiation passes through the optically transparent handler wafer 10 to heat the first adhesive layer 16 and the second adhesive layer 18. When the first adhesive layer 16 and the second adhesive layer 18 are sufficiently heated, the plurality of semiconductor devices 20 may be released from the second adhesive layer 18 and the handler wafer 10.

There are several difficulties with the prior art process described in FIGS. 1(a) to 1(f). The first is that expensive optically transparent handler wafers must be used. The second is that a high heat budget is needed to input enough heat into the handler wafer and the adhesive layers to allow separation of the semiconductor devices. The third is that an optical or UV laser must be used to provide the heat needed to cause separation of the semiconductor devices from the handler wafer.

The present inventors have proposed the addition of an amorphous carbon layer underneath one or both of the adhesive layers to enable the use of silicon wafer handler wafers and to provide more efficient heating of the adhesive layers. The amorphous carbon layer may also reduce the amount of heat needed to heat the adhesive layers due to the good absorption of heat by the amorphous carbon layer in the infra red radiation spectrum.

Amorphous carbon does not have any crystalline structure Amorphous carbon typically contains some hydrogen due to hydrogen-terminated carbon bonds resulting from the partial non-reaction of precursors, especially at lower temperature and/or lower plasma power during the deposition process. The amorphous carbon films used in the exemplary embodiments may have hydrogen atomic concentration from about 1% to about 40%.

Figure 2:
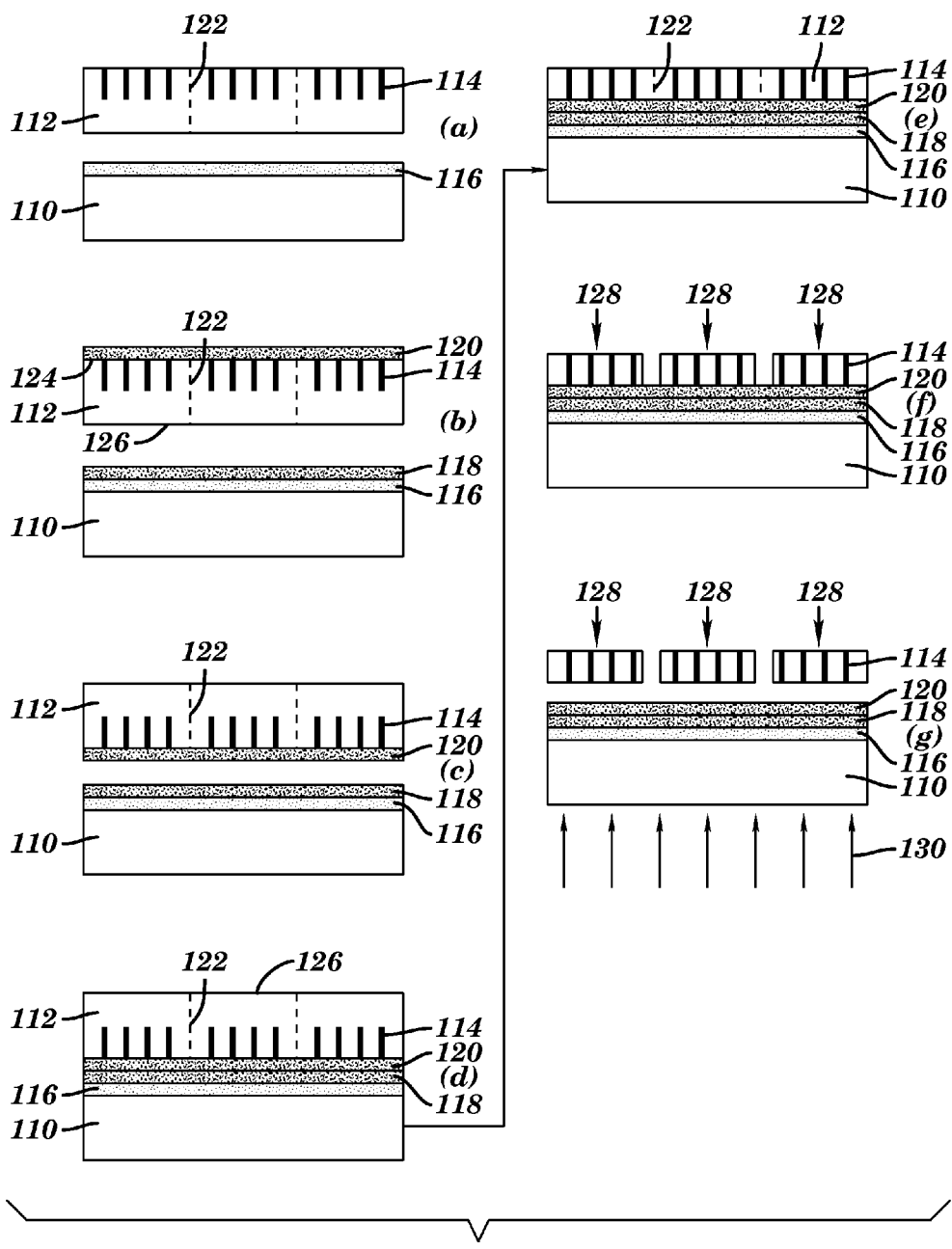
FIGS. 2(a) to (g) illustrate an exemplary embodiment process for removing a handler wafer from a plurality of semiconductor devices.

Referring now to FIGS. 2(a) to (g), there is disclosed a first exemplary embodiment. As shown in FIG. 2(a), there is a handler wafer 110 and a semiconductor device wafer 112. The handler wafer 110 may be made of any material that is compatible with semiconductor processing. Preferably, the handler wafer 110 is made from silicon which is advantageous in that it has a coefficient of thermal expansion that is compatible with the semiconductor device 112 and may be made on the same equipment that fabricates the semiconductor device wafer 112. Although not as preferred, the handler wafer 110 may be made from an optically transparent wafer (as described above) which may have been engineered to have a coefficient of thermal expansion compatible with the coefficient of thermal expansion of the semiconductor device wafer 112.

The handler wafer 110 is nonfunctional in that it contains no semiconductor devices or any wiring. The semiconductor device wafer 112 is made of a semiconductor material, usually silicon but could be any of the semiconductor materials currently in use or contemplated for use. The semiconductor device wafer 112 may further comprise through silicon vias (TSVs) 114 which extend at least partly through the semiconductor device wafer 112. The semiconductor device wafer 112 may comprise a plurality of semiconductor devices. Dotted lines 122 indicate the approximate location where the semiconductor device wafer 112 may be diced to result in the plurality of semiconductor devices. Each of the semiconductor devices may comprise transistors, capacitors, other components and various wirings, all of which are not shown for clarity.

In this first exemplary embodiment, an amorphous carbon layer 116 is formed or deposited on the handler wafer 110. A preferred process for forming the amorphous carbon layer 116 is plasma enhanced chemical vapor deposition (PECVD). The amorphous carbon layer 116 may be formed to a thickness of about 100 to 5000 angstroms, most preferably about 2000 angstroms. In general, the thickness of the amorphous carbon layer 116 should be thick enough to provide efficient heat distribution but not so thick as to cause spalling.

Gases typically used in the PECVD process may include $C_2H_6$, $C_3H_8$, $C_2H_2$, etc. The PECVD process may also be done in the presence of helium. Process pressure may be in the range of 1 to 100 Torr. Process temperature is preferably in the 100 to 400° C. range. The plasma power may be high frequency RF or dual high frequency RF and low frequency RF and may vary from 50 W to 3000 W.

Referring now to FIG. 2(b), at least one of the handler wafer 110 and the semiconductor device wafer 112 may further comprise an adhesive. As shown in FIG. 2(b), the handler wafer 110 may further comprise a first adhesive layer 118 and the semiconductor device wafer 112 may further comprise a second adhesive layer 120. The first adhesive layer 118 may be formed or deposited directly on the amorphous carbon layer 116. The semiconductor wafer 112 may comprise an active side 124, which contains the transistors, capacitors, etc. and the back end of the line (BEOL) wiring, and an inactive side 126, which contains no devices or wirings. The second adhesive layer 120 is formed on the active side 124 of the semiconductor device wafer 112. Some adhesives that may be used for the first adhesive layer 118 and the second adhesive layer 120 may include, for purposes of illustration and not limitation, polyimide-based adhesives, wax-based adhesives, thermoplastic polymers, and mixtures thereof.

Referring now to FIG. 2(c), the semiconductor device wafer 112 is flipped over so that the second adhesive layer 120 on the semiconductor device wafer 112 faces the first adhesive layer 118 on the handler wafer 110. The semiconductor device wafer 112 is also properly aligned with the handler wafer 110 in this process.

Referring now to FIG. 2(d), the handler wafer 110 and the semiconductor device wafer 112 may undergo a thermal compression bonding process in which the first adhesive layer 118 adheres to the second adhesive layer 120.

Thereafter, the inactive side 126 of the semiconductor device wafer 112 undergoes a thinning process to reduce the thickness of the semiconductor device wafer 112 as now shown in FIG. 2(e) after thinning.

The semiconductor device wafer 112 may undergo a dicing process in which a saw or laser singulates the semiconductor devices 128 at dotted lines 122 (shown in FIG. 2(e)) within the semiconductor device wafer 112. "Singulate" means that a wafer is diced into the individual semiconductor devices. As shown in FIG. 2(f), there are a plurality of semiconductor devices 128.

At this point in the process, the plurality of semiconductor devices 128 are still adhered to the second adhesive layer 120. Referring now to FIG. 2(g), the handler wafer 110 is exposed to radiation 130 from a source such as a laser. If the handler wafer 110 is made from the preferred silicon material, the radiation may be infrared (IR) radiation. Alternatively, if the handler wafer 110 is an optically transparent material, then the laser radiation is typically optical or UV radiation. The radiation 130 passes through the handler wafer 110 to make contact with the amorphous carbon layer 116 which absorbs the heat from radiation 130 and then re-emits it to heat the first adhesive layer 118 and the second adhesive layer 120. When the first adhesive layer 118 and the second adhesive layer 120 are sufficiently heated, the plurality of semiconductor devices 128 may be released from the second adhesive layer 120 and the handler wafer 110.

The amorphous carbon layer 116 provides an efficient heating mechanism to heat the first adhesive layer 118 and the second adhesive layer 120. By evenly heating the first adhesive layer 118 and the second adhesive layer 120, the intensity of the radiation 130 may be reduced to avoid excessive heating of the semiconductor devices 128. By placing the absorber layer (amorphous carbon layer 116) on the handler wafer side, localization of the heating effect may be enabled on the handler wafer side of the adhesive bond that is further away from the semiconductor devices, which could be more sensitive to thermal steps in terms of reliability.

As shown in FIGS. 2(f) and 2(g), the semiconductor device wafer 112 is diced before each of the semiconductor devices 128 are individually removed from the second adhesive layer 120. Referring now to FIGS. 4(a) and (b), a second exemplary embodiment is illustrated in which FIG. 4(a) shows the semiconductor device wafer 112 thinned and ready for dicing and FIG. 4(b) shows the semiconductor device wafer 112 is removed from the second adhesive layer 120 without the singulating process illustrated in FIG. 2(f). The individual semiconductor devices 128 may be singulated in a separate process after removal from the handler wafer 110.

Referring now to FIGS. 3(a) to (g), there is disclosed a third exemplary embodiment. The handler wafer 210 and the semiconductor device wafer 212 may be the same handler wafer and semiconductor device wafer as described with respect to the first exemplary embodiment in FIGS. 2(a) to (g).

Dotted lines 220 indicate the approximate location where the semiconductor device wafer 212 may be diced to result in the plurality of semiconductor devices. Each of the semiconductor devices may comprise transistors, capacitors, other components and various wirings, all of which are not shown for clarity.

In this third exemplary embodiment, an amorphous carbon layer 214 is formed on the handler wafer 210. A preferred process for forming the amorphous carbon layer 214 is the PECVD process described previously. In this third exemplary embodiment, an amorphous carbon layer 216 may be also formed on the active side 218 of the semiconductor device wafer 212.

Figure 3:
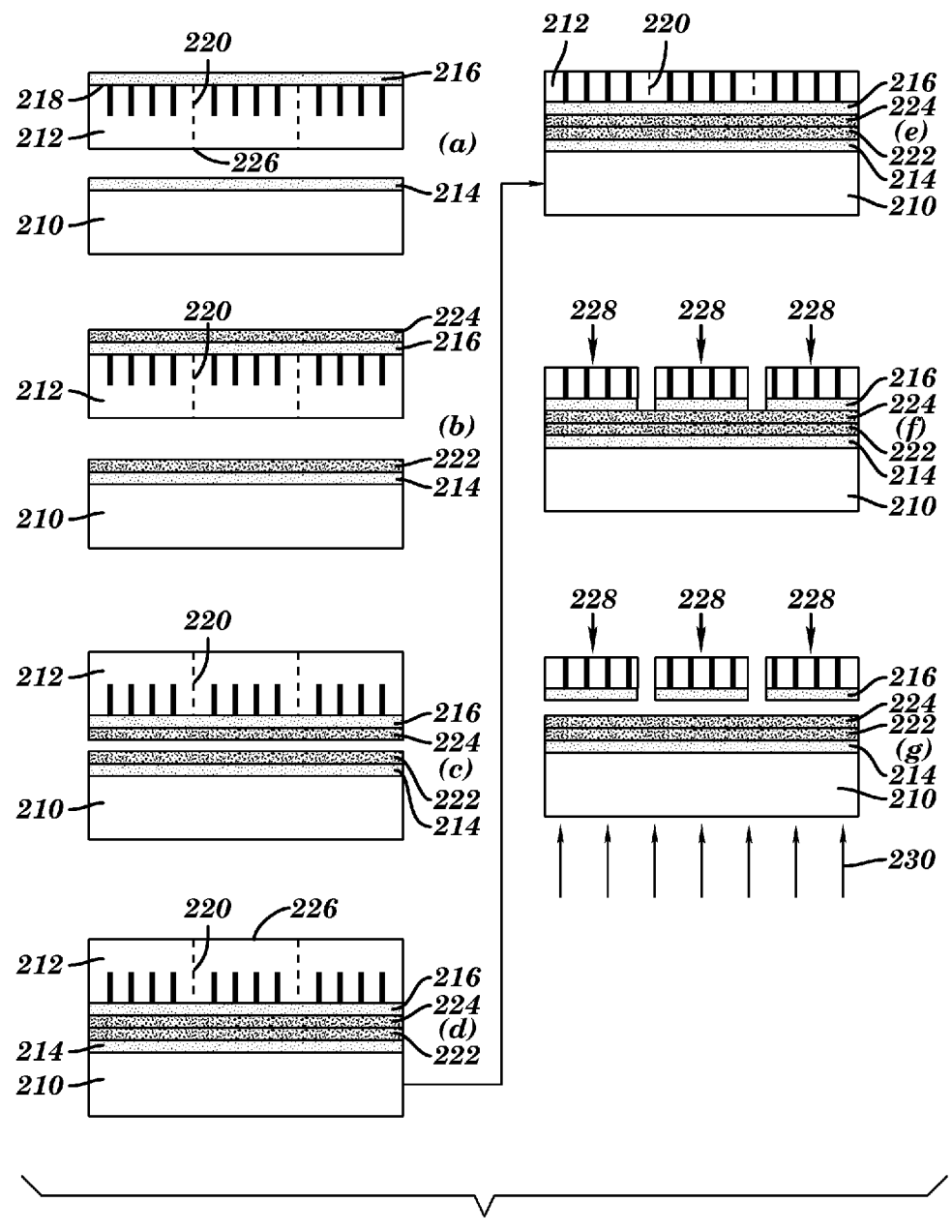
FIGS. 3(a) to (g) illustrate an exemplary embodiment process for removing a handler wafer from a plurality of semiconductor devices.

Referring now to FIG. 3(b), at least one of the handler wafer 210 and the semiconductor device wafer 212 may further comprise an adhesive. As shown in FIG. 3(b), the handler wafer 210 may further comprise a first adhesive layer 222 and the semiconductor device wafer 212 may further comprise a second adhesive layer 224. The first adhesive layer 222 may be formed or deposited directly on the amorphous carbon layer 214 while the second adhesive layer 224 may be formed or deposited directly on the amorphous carbon layer 216. The adhesive layers 222, 224 may comprise the adhesives described previously. The semiconductor wafer 212 may also comprise an inactive side 226, which contains no devices or wirings.

Referring now to FIG. 3(c), the semiconductor device wafer 212 is flipped over so that the second adhesive layer 224 on the semiconductor device wafer 212 faces the first adhesive layer 222 on the handler wafer 210. The semiconductor device wafer 212 is also properly aligned with the handler wafer 110 in this process.

Referring now to FIG. 3(d), the handler wafer 210 and the semiconductor device wafer 212 may undergo a thermal compression bonding process in which the first adhesive layer 222 adheres to the second adhesive layer 224.

Thereafter, the inactive side 226 of the semiconductor device wafer 212 undergoes a thinning process to reduce the thickness of the semiconductor device wafer 212 as now shown in FIG. 3(e) after thinning.

The semiconductor device wafer 212 may undergo a dicing process in which a saw or laser singulates the semiconductor devices 228 at dotted lines 220 (shown in FIG. 3(e)) within the semiconductor device wafer 212. As shown in FIG. 3(f), there are a plurality of semiconductor devices 228. It is noted that during the dicing process described in FIG. 3(f), the amorphous carbon layer 216 is diced along with the plurality of semiconductor devices 228.

At this point in the process, the plurality of semiconductor devices 228 are still adhered to the second adhesive layer 224. Referring now to FIG. 3(g), the handler wafer 210 is exposed to radiation 130 from a source such as a laser as described previously. Preferably the handler wafer 210 is silicon and the radiation is IR radiation. The radiation 230 passes through the handler wafer 210 to make contact with the amorphous carbon layer 214 which absorbs the heat from radiation 230 and then re-emitted to heat the first adhesive layer 222 and the second adhesive layer 224. When the first adhesive layer 222 and the second adhesive layer 224 are sufficiently heated, the plurality of semiconductor devices 228 may be released from the second adhesive layer 224 and the handler wafer 210. It is noted that amorphous carbon layer 216 may be released along with the plurality of semiconductor devices 228.

The amorphous carbon layer 214 provides an efficient heating mechanism to heat the first adhesive layer 222 and the second adhesive layer 224. By evenly heating the first adhesive layer 222 and the second adhesive layer 224, the intensity of the radiation 230 may be reduced to avoid excessive heating of the semiconductor devices 228, with the same advantage of localizing the heating effects as described earlier.

Moreover, in this exemplary embodiment, the second absorber layer (amorphous carbon layer 216) on the semiconductor device side of the adhesive bond may serve as a means to make sure that any radiation not absorbed in the first absorber layer (amorphous carbon layer 214) is absorbed in the second absorber layer. It may also facilitate even better and more uniform temperature in the adhesive bond.

In a subsequent process, the plurality of semiconductor devices 228 may be exposed to an oxidizing atmosphere while being heated to remove the amorphous carbon layer 216 from the plurality of semiconductor devices 228. In one preferred process, the amorphous carbon layer 216 may be exposed to and heated by a laser in an oxidizing atmosphere to essentially oxidize and remove the amorphous carbon layer 216. An additional advantage of this third exemplary embodiment is that any adhesive residue from the second adhesive layer 224 is removed when the amorphous carbon layer 216 is removed.

As shown in FIGS. 3(f) and 3(g), the semiconductor device wafer 212 is diced before each of the semiconductor devices 228 are individually removed from the second adhesive layer 224. Referring now to FIGS. 5(a) and (b), a fourth exemplary embodiment is illustrated in which FIG. 5(a) shows the semiconductor device wafer 212 thinned and ready for dicing and FIG. 5(b) shows the semiconductor device wafer 212 is removed from the second adhesive layer 224 without the singulating process illustrated in FIG. 3(f). The individual semiconductor devices 228 may be singulated in a separate process after removal from the handler wafer 210.

Also contemplated within the scope of the exemplary embodiments is an assembly of a semiconductor wafer and a handler wafer as shown in, for example, FIGS. 2(d) and 3(d). The assembly includes a handler wafer 110, 210 and a semiconductor device wafer 112, 212 having a plurality of semiconductor devices, the semiconductor device wafer having an active surface side 124, 218 and an inactive surface side 126, 226. There is formed or deposited an amorphous carbon layer 116, 214 on a surface of the handler wafer. There may be a first adhesive layer 118 222 on the amorphous carbon layer 116, 214 of the handler wafer 110, 210. A second adhesive layer 120, 224 may be deposited on the active surface side of the semiconductor device wafer 112, 212. In one embodiment as illustrated in FIG. 2(d), the amorphous carbon layer 116 may be formed or deposited only on the handler wafer 110. In one embodiment as illustrated in FIG. 3(d), the amorphous carbon layer 214 may be formed or deposited on the handler wafer 210 and the amorphous carbon layer 216 may in addition be formed or deposited on the semiconductor device wafer 212. The handler wafer 110, 210 may be joined to the semiconductor device wafer 112, 212 through the respective first adhesive layer 118, 222 and the second adhesive layer 120, 224.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of removing a handler wafer comprising:
   providing a handler wafer formed of a single layer and a semiconductor device wafer having a plurality of semiconductor devices, the semiconductor device wafer having an active surface side and an inactive surface side;
   applying an amorphous carbon layer directly to a surface of the handler wafer;
   applying an adhesive layer directly to at least one of the amorphous carbon layer of the handler wafer and the active surface side of the semiconductor device wafer;
   joining the handler wafer to the semiconductor device wafer through the adhesive layer such that the amorphous carbon layer is between the surface of the handler wafer and the adhesive layer;
   applying laser radiation to the handler wafer to cause heating of the amorphous carbon layer that in turn causes heating of the adhesive layer; and
   separating the plurality of semiconductor devices of the semiconductor device wafer from the handler wafer.

2. The method of claim 1 wherein between the steps of joining and applying laser radiation, further comprising thinning the semiconductor device wafer on the inactive surface side of the semiconductor device wafer.

3. The method of claim 2 wherein the semiconductor device wafer comprises through silicon vias and the step of thinning proceeds until the through silicon vias are exposed on the inactive side of the semiconductor device wafer.

4. The method of claim 1 wherein between joining and applying laser radiation, further comprising dicing the semiconductor device wafer into the plurality of semiconductor devices and during the step of separating, separating each of the plurality of semiconductor devices from the handler wafer.

5. The method of claim 1 wherein the semiconductor device wafer is unsingulated and the entire semiconductor wafer is removed at one time from the handler wafer.

6. The method of claim 1 wherein the handler wafer is a silicon wafer and the laser radiation is infrared radiation.

7. The method of claim 1 wherein the step of applying an amorphous carbon layer is by a plasma enhanced chemical vapor deposition (PECVD) process.

8. The method of claim 7 wherein the PECVD process is performed at a temperature of 100 to 400° C.

9. The method of claim 1 wherein the amorphous carbon layer has a thickness of 100 to 5000 angstroms.

10. A method of removing a handler wafer comprising:
    providing a handler wafer formed of a single layer and a semiconductor device wafer having a plurality of semiconductor devices, the semiconductor device wafer having an active surface side and an inactive surface side;
    applying a first amorphous carbon layer directly to a surface of the handler wafer;
    applying a second amorphous carbon layer directly to the active surface side of the semiconductor device wafer;
    applying an adhesive layer directly to at least one of the first amorphous carbon layer of the handler wafer and the second amorphous carbon layer of the semiconductor device wafer;
    joining the handler wafer to the semiconductor device wafer through the adhesive layer such that the first amorphous carbon layer is between the surface of the handler wafer and the adhesive layer and the second amorphous layer is between the active surface side of the semiconductor device wafer and the adhesive layer;
    applying laser radiation to the handler wafer to cause heating of at least the first amorphous carbon layer that in turn causes heating of the adhesive layer; and
    separating the plurality of semiconductor devices of the semiconductor device wafer from the handler wafer.

11. The method of claim 10 wherein the second amorphous carbon layer remains on the plurality of semiconductor devices after separating from the handler wafer.

12. The method of claim 11 further comprising removing the second amorphous carbon layer from plurality of semiconductor devices after separating from the handler wafer.

13. The method of claim 10 wherein between the steps of joining and applying laser radiation, further comprising thinning the semiconductor device wafer on the inactive surface side of the semiconductor device wafer.

14. The method of claim 13 wherein the semiconductor device wafer comprises through silicon vias and the step of thinning proceeds until the through silicon vias are exposed on the inactive side of the semiconductor device wafer.

15. The method of claim 10 wherein between joining and applying laser radiation, further comprising dicing the semiconductor device wafer into the plurality of semiconductor devices and during the step of separating, separating each of the plurality of semiconductor devices from the handler wafer.

16. The method of claim 10 wherein the semiconductor device wafer is unsingulated and the entire semiconductor wafer is removed at one time from the handler wafer.

17. The method of claim 10 wherein the steps of applying the first and second amorphous carbon layers are by a plasma enhanced chemical vapor deposition (PECVD) process.

18. The method of claim 17 wherein the PECVD process is performed at a temperature of 100 to 400° C.

* * * * *